United States Patent
Albrecht

(10) Patent No.: US 7,023,894 B2
(45) Date of Patent: Apr. 4, 2006

(54) OPTICALLY PUMPED SEMICONDUCTOR LASER AND METHOD FOR PRODUCING THE SAME

(75) Inventor: Tony Albrecht, Bad Abbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 294 days.

(21) Appl. No.: 10/679,153

(22) Filed: Oct. 10, 2003

(65) Prior Publication Data
US 2004/0131101 A1 Jul. 8, 2004

(30) Foreign Application Priority Data
Oct. 18, 2002 (DE) ............... 102 48 768

(51) Int. Cl.
*H01S 3/091* (2006.01)
*H01S 5/00* (2006.01)
(52) U.S. Cl. .......................... 372/75; 372/50.11
(58) Field of Classification Search .......... 372/70, 372/75, 50.1, 50.11
See application file for complete search history.

(56) References Cited

U.S. PATENT DOCUMENTS

| | | | | |
|---|---|---|---|---|
| 5,796,771 A | * | 8/1998 | DenBaars et al. | 372/75 |
| 6,687,280 B1 | * | 2/2004 | Kajita | 372/96 |
| 2002/0001328 A1 | | 1/2002 | Albrecht et al. | |
| 2005/0226302 A1 | * | 10/2005 | Lutgen | 372/70 |

FOREIGN PATENT DOCUMENTS

| | | |
|---|---|---|
| DE | 100 26 734 A1 | 12/2001 |
| DE | 101 08 079 A1 | 9/2002 |
| EP | 1 220 392 A2 | 12/2001 |

* cited by examiner

*Primary Examiner*—Zandra Smith
*Assistant Examiner*—Marcia A. Golub
(74) *Attorney, Agent, or Firm*—Cohen, Pontani, Lieberman & Pavane

(57) ABSTRACT

An optically pumped semiconductor laser device having a substrate (12) having a first main area (14) and a second main area (16), a pump laser (30) and a vertically emitting laser (40) optically pumped by the pump laser (30) being arranged on the first main area (14). The first main area (14) of the substrate (12) is patterned and has first regions (20) situated at a higher level and also second regions (18) situated at a lower level. The pump laser (30) is arranged on a region (20) situated at a higher level of the substrate (12), and the vertically emitting laser (40) is arranged above intermediate layers (50, 30') on a region (18) situated at a lower level of the substrate (12). The height difference (Δ) between the first (20) and second (18) regions of the substrate (12) and the layer thickness of the intermediate layers (50, 30') is chosen in such a way that the pump laser (30) and the vertically emitting laser (40) are situated at the same level. A substrate which is patterned in this way enables semiconductor layers of the pump laser and of the vertically emitting laser to be applied together in a single epitaxy step.

9 Claims, 2 Drawing Sheets

OPTICALLY PUMPED SEMICONDUCTOR LASER AND METHOD FOR PRODUCING THE SAME

This patent application claims the priority of German patent application 102 48 768.5, the disclosure content of which is hereby incorporated by reference.

FIELD OF THE INVENTION

The invention relates to an optically pumped semiconductor laser device having a substrate having a first main area and a second main area, a pump laser and a vertically emitting laser optically pumped by the pump laser being arranged on the first main area. The invention also relates to a method for producing a semiconductor laser device of this type.

BACKGROUND OF THE INVENTION

An optically pumped surface emitting semiconductor laser device is disclosed in the published patent application DE 100 26 734 A1, for example, where the radiation-generating quantum well structure and an edge emitting semiconductor structure serving as pump radiation source are applied epitaxially one after the other on a common substrate.

In this case, after the growth and patterning of the radiation-generating quantum well structure, the monolithic pump radiation source is grown in a second epitaxy step in such a way that its waveguides are aligned as exactly as possible with the radiation-generating quantum well structure. The layer thicknesses of the individual semiconductor layers can be established very precisely during the epitaxy, thereby advantageously achieving a high positioning accuracy of the edge emitting semiconductor structure with respect to the radiation-generating quantum well structure. The production outlay for such a semiconductor laser device is considerable, however, due to the second epitaxy.

SUMMARY OF THE INVENTION

One object of the invention is to provide a semiconductor laser device of the type mentioned above in the introduction which can be produced with a lower outlay and at lower cost.

This and other objects are attained in accordance with one aspect of the invention directed to an optically pumped semiconductor laser device having a substrate having a first main area and a second main area, a pump laser and a vertically emitting laser optically pumped by the pump laser being arranged on the first main area. The first main area of the substrate is patterned and has first regions situated at a higher level and also second regions situated at a lower level. The pump laser is arranged on a region situated at a higher level of the substrate, and the vertically emitting laser is arranged above intermediate layers on a region situated at a lower level of the substrate, the height difference between the first and second regions of the substrate and the layer thickness of the intermediate layers being chosen in such a way that the pump laser and the vertically emitting laser are situated at the same level.

The invention is based, in principle, on the concept of using a patterned growth substrate to enable the layer structures of the pump laser and of the vertically emitting laser to be grown in a single epitaxial step. By tailoring the substrate feature sizes and layer thicknesses to one another, it is possible to ensure that, during operation, the pump radiation of the pump laser passes into the vertically emitting laser and is absorbed there.

In particular, it is provided that the pump laser is formed by a semiconductor layer sequence and that the intermediate layers comprise the semiconductor layer sequence of the pump laser.

In a preferred embodiment of the semiconductor device according to the invention, it is furthermore provided that the intermediate layers comprise a mirror layer, which forms a mirror of a resonator for the vertically emitting laser. A second resonator mirror may for instance be applied on the layer sequence that forms the vertically emitting laser or be formed by an external mirror.

The first regions situated at a higher level and the second regions situated at a lower level of the substrate are advantageously separated from one another by projecting webs. The projecting webs are expediently transparent to the radiation generated by the pump laser. If GaAs, for instance, is used as substrate material, then the substrate webs are transmissive for wavelengths of greater than 920 nm.

In an expedient refinement of the invention, the mirror layer is formed as a Bragg mirror.

In this connection, it is preferred if the vertically emitting laser is formed by a semiconductor layer sequence which has a quantum well structure as radiation-generating active layer.

Expediently, during operation, the radiation generated by the pump laser for pumping the vertically emitting laser is coupled into an active layer of the vertically emitting laser in the lateral direction.

In a preferred refinement of the semiconductor laser device according to the invention, the substrate is formed from GaAs.

Another object of the invention is directed to a method for producing an optically pumped semiconductor laser device having an optically vertically emitting laser and at least one pump laser. A patterned substrate is provided having first regions situated at a higher level and second regions situated at a lower level. An edge emitting semiconductor layer sequence is applied to the substrate. A surface emitting semiconductor layer sequence is applied with a radiation-generating active layer, the height differences between the first and second regions of the substrate being formed in such a way that the edge emitting semiconductor layer sequence of the first regions is situated at the same level as the surface emitting semiconductor layer sequence of the second regions in order to form a pump laser for the optically vertically emitting laser during operation. Layers arranged above the edge emitting semiconductor layer sequence in the first regions are removed in order to uncover the edge emitting semiconductor layer sequence there.

In a preferred refinement, in the case of the method according to the invention, a mirror layer is applied to the edge emitting semiconductor layer sequence. The surface emitting semiconductor layer sequence is then applied to the mirror layer.

In an advantageous manner, after the layers arranged above the edge emitting semiconductor layer sequence have been removed, contacts are applied to the edge emitting semiconductor layer sequence of the first regions.

The step of provision of a patterned substrate preferably comprises the dry etching of a planar substrate in order to produce the first regions situated at a higher level and the second regions situated at a lower level.

Further advantageous refinements, features and details of the invention emerge from the dependent claims, the description of the exemplary embodiment and the drawings.

BRIEF DESCRIPTION OF THE DRAWINGS

The invention will be explained in more detail below using an exemplary embodiment in connection with the drawings. Only the elements essential for understanding the invention are illustrated in each case. In the figures.

DETAILED DESCRIPTION OF THE DRAWINGS

Figure 1:
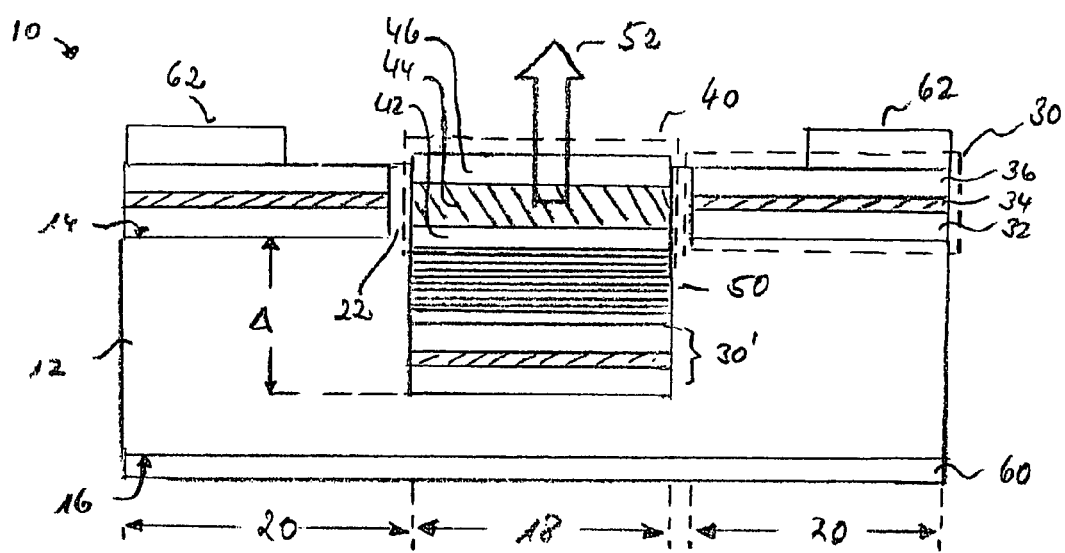
FIG. 1 shows a diagrammatic sectional view of an optically pumped semiconductor laser device according to an exemplary embodiment of the invention.

FIG. 1 shows a diagrammatic sectional view of an optically pumped semiconductor laser device according to an exemplary embodiment of the invention, said device being designated generally by 10.

The semiconductor laser device 10 contains a substrate 12 having a first main area 14 and a second main area 16. The first main area 14 of the substrate is patterned and has regions 20 situated at a higher level and regions 18 situated at a lower level, which are separated from one another by substrate webs 22. In the exemplary embodiment, two pump lasers 30 are grown on the regions 20 situated at a higher level of the substrate. On the region 18 situated at a lower level, a vertically emitting laser 40 is grown over a series of intermediate layers 50, 30' which will be explained in more detail below.

In addition to further layers that are not illustrated, the pump lasers 30 in each case contain a first waveguide layer 32, a radiation-generating active layer 34 and a second waveguide layer 36. Top side contacts 62 and an underside contact 60 serve for supplying power to the pump lasers 30.

The vertically emitting laser 40 comprises a radiation-generating active layer 44, for example a multiple quantum well structure, which is embedded between two waveguide layers 42 and 46.

The height difference Δ between the substrate regions 20 situated at a higher level and the substrate regions 18 situated at a lower level and the layer thickness of the intermediate layers 50 and 30' are coordinated with one another in such a way that the active layers 34 of the pump lasers 30 and the active layer 44 of the vertically emitting laser 40 are adjusted to the same level. During operation of the device, the pump radiation of the pump lasers 30 is then coupled laterally exactly into the active layer 44 and absorbed there.

The intermediate layers arranged below the vertically emitting laser 40 comprise a distributed Bragg mirror (DBR, distributed Bragg reflector) 50, which is formed for example from a few tens of periods of undoped $Al_{0.1}Ga_{0.9}As$ and $Al_{0.9}Ga_{0.1}As$ layers and has a high reflectivity of >99%.

Arranged below the Bragg mirror 50 is a semiconductor layer sequence 30', which corresponds, in the sequence of its layers, exactly to that of the pump laser 30 since it was grown at the same time as the latter on the patterned substrate.

Overall, the configuration shown enables the structures of the pump lasers 30 and of the vertically emitting laser 40 to be grown in a single epitaxial step. This will be explained in more detail as below with reference to the intermediate steps illustrated in FIGS. 2 and 3 in the production of the semiconductor laser device 10.

Figure 2:
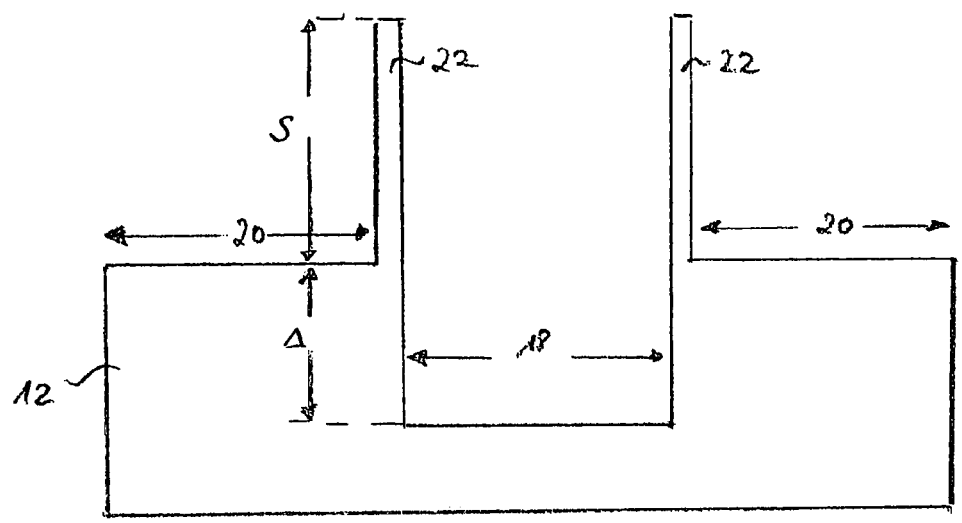
FIGS. 2 and 3 show intermediate steps in the production of the semiconductor laser device of FIG. 1 in a diagrammatic illustration.
Figure 3:
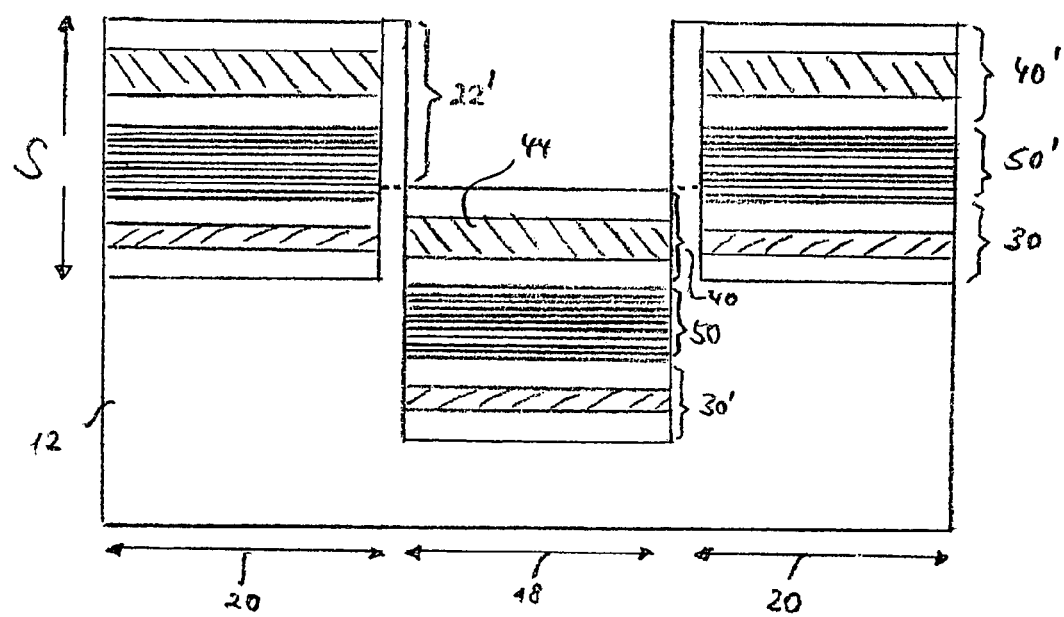

In a first step, steps are etched into the GaAs substrate 12 by means of a dry etching method, thus resulting in regions 20 situated at a higher level and regions 18 situated at a lower level, which are separated from one another by thin substrate webs 22. In this case, the step height Δ results, in connection with the layer thickness of the pump laser layers 30' and of the Bragg mirror 50, from the later alignment of the waveguide layers of the pump lasers 30 to the active layer of the vertically emitting laser 40. The height S of the substrate webs results from the total thickness of the semiconductor layers grown in the subsequent steps (FIG. 3). The GaAs substrate 12 patterned according to these stipulations is illustrated in FIG. 2.

The layer sequences 30 and 30', respectively, for the edge emitting pump laser, the layer sequences 50 and 50', respectively, for the Bragg mirror and the layer sequences 40 and 40', respectively, for the vertically emitting laser are then grown one after the other, as shown in the illustration of FIG. 3. In this case, the same sequence of semiconductor layers is applied to the regions 18 situated at a lower level and the regions situated at a higher level. The suitable choice of the layer thickness of the layer sequence of the pump laser, of the Bragg mirror and of the height difference A ensures that the waveguides of the pump laser 30, for optimum lateral pumping, are adjusted exactly to the active zone 44 of the vertically emitting laser 40.

The layers 40' and 50' that are not required are subsequently removed, thereby uncovering the pump lasers 30 of the substrate regions 20 situated at a higher level. During this step, the substrate webs 22 are also removed in an upper region 22'. Afterward, the contacts 60 and 62 for feeding power to the pump laser 30 are applied and the individual semiconductor laser devices are patterned and singulated in a known manner (FIG. 1).

Compared with known configurations, the invention's growth of the pump lasers 30 and of the vertically emitting laser 40 in one epitaxy step affords the advantage of significantly reduced production costs. In this respect, the growth of epitaxial layers on GaAs is technologically simpler than the growth on AlGaAs layers or AlGaAs substrates that is otherwise necessary. The overgrowth of AlGaAs layers can be omitted in the solution according to the invention.

While the invention has been shown and described in particular with reference to preferred exemplary embodiments, for the person skilled in the art it goes without saying that changes can be made in form and details without departing from the concept and scope of the invention. Accordingly, the disclosure of the present invention is not intended to be restrictive. Instead, the disclosure of the present invention is intended to illustrate the scope of the invention which is set forth in the claims which follow. The invention encompasses every new feature and also every combination of features, which in particular includes every combination of features in the patent claims, even if said combination is not specified explicitly in the patent claims.

The invention claimed is:

1. An optically pumped semiconductor laser device having a substrate (12) having a first main area (14) and a second main area (16), a pump laser (30) and a vertically emitting laser (40) optically pumped by the pump laser (30) being arranged on the first main area (14), wherein
the first main area (14) of the substrate (12) is patterned and has first regions (20) situated at a higher level and also second regions (18) situated at a lower level,
the pump laser (30) is arranged on a region (20) situated at a higher level of the substrate (12), and the vertically emitting laser (40) is arranged above intermediate layers (50, 30') on a region (18) situated at a lower level of the substrate (12), the height difference (Δ) between the first (20) and second (18) regions of the substrate (12) and the layer thickness of the intermediate layers (50, 30') being chosen in such a way that the pump laser (30) and the vertically emitting laser (40) are situated at the same level.

2. The semiconductor device as claimed in claim 1, wherein the pump laser (30) is formed by a semiconductor layer sequence and the intermediate layers (50, 30') comprise the semiconductor layer sequence (30') of the pump laser (30).

3. The semiconductor device as claimed in claim 1, wherein the intermediate layers (50, 30') comprise a mirror layer (50), which forms a mirror of a resonator for the vertically emitting laser (40).

4. The semiconductor device as claimed in claim 1, wherein the first regions (20) situated at a higher level and the second regions (18) situated at a lower level of the substrate are separated from one another by projecting webs (22).

5. The semiconductor device as claimed in claim 4, wherein the projecting webs (22) are transparent to the radiation generated by the pump laser (30).

6. The semiconductor device as claimed in claim 3, wherein the mirror layer is formed as a Bragg mirror (50).

7. The semiconductor device as claimed in claim 1, wherein the vertically emitting laser (40) is formed by a semiconductor layer sequence which has a quantum well structure as radiation-generating active layer (44).

8. The semiconductor device as claimed in claim 1, wherein during operation, the radiation generated by the pump laser (30) for pumping the vertically emitting laser (40) is coupled into an active layer (44) of the vertically emitting laser in the lateral direction.

9. The semiconductor device as claimed in claim 1, wherein the substrate (12) is formed from GaAs.

* * * * *